United States Patent [19]

Costello et al.

[11] Patent Number: 5,176,749

[45] Date of Patent: Jan. 5, 1993

[54] PREFLUX COATING COMPOSITION FOR COPPER

[75] Inventors: Bernard J. Costello, Princeton; James Langan, Red Bank; Robert Harkins, Roebling, all of N.J.

[73] Assignee: Argus International, Ringoes, N.J.

[21] Appl. No.: 718,004

[22] Filed: Jun. 20, 1991

[51] Int. Cl.⁵ ............................................. C08L 93/04
[52] U.S. Cl. .................................... 106/237; 148/23; 228/211
[58] Field of Search .......................... 106/237; 148/23; 228/211

[56] References Cited

U.S. PATENT DOCUMENTS

| | | | |
|---|---|---|---|
| 2,733,155 | 1/1956 | Williams et al. | 106/237 |
| 3,352,701 | 11/1967 | Goetz | 106/237 |
| 3,366,499 | 1/1968 | Liebscher | 106/237 |

Primary Examiner—David Brunsman

[57] ABSTRACT

A preflux composition suitable for use as a preflux for protecting the solderability of copper during a heating cycle comprising rosin, antioxidant, and a solvent system comprised of glycol ether and terpene and further including a dibasic acid, process for protecting the solderability of copper which is to be subjected to a heating cycle prior to soldering comprising using said preflux composition, and articles comprising printed circuits or wiring boards which have copper areas coated with said preflux composition.

3 Claims, No Drawings

PREFLUX COATING COMPOSITION FOR COPPER

BACKGROUND OF THE INVENTION

1. Field of the Invention

This invention is in the field of printed circuits and relates generally to novel compositions useful for preflux coatings for copper to protect the solderability of the copper during heating cycles.

2. Description of the Prior Art

Printed wiring boards having copper surfaces are subjected to one or more heating cycles when being assembled. Modern circuits utilize surface mount assembly technology wherein the components are soldered directly to the pads on the surface of the printed wiring board. This method employs soldering on both sides of the board and may be commingled with conventional "through-hole" assembly where the component leads are inserted in holes provided in the board. The inserted leads are subsequently soldered.

The assembly sequence typically proceeds in stages. Each type of component is assembled as a group and then each group is soldered; and so on until all components are soldered. For example, the first step may be to assemble all surface mounted components on the top side and solder by infrared reflow. The next step may be to attach all components to the underside of the board with epoxy adhesive which requires heat to cause the epoxy to cure. The final step may require insertion of leaded components through the board and wave solder the inserted components and the surface mounted components that were previously attached with epoxy adhesive. In this typical sequence, the printed wiring board is subjected to three heating cycles, each of which causes degradation to the copper surface solderability.

Various methods have been proposed and used to preserve the solderability of the copper surfaces which are to be subjected to heat during an earlier cycle but are to be soldered in a later step during the process. Each of the prior art methods suffers from one or more disadvantages or problems.

One method is to coat the copper with a thin layer of solder, thus protecting the solderability. A problem with this method is that the thickness of the solder coating is critical; if the coating is too thick, it presents an obstacle to automatic placement of components on the surface. If it is too thin, non-solderable intermetallic coatings form on the surface.

A second prior art method is to coat the copper with a material such as benzotriozole and benzophenone or various types of imidizols. A disadvantage of this process is the tendency of these types of materials to lose their protective qualities during successive heating cycles.

A third method, known as the "preflux" method, is to apply a varnish-like material such as a rosin dissolved in a solvent, and drying to form a continuous coating on the copper which excludes moisture and, to a lesser extent, oxygen and their detrimental effect on solderability. Various methods have been used to enhance the stability of such coatings to prevent degradation during multiple heating cycles, among which have been development of synthetic rosins with known and predictable stability properties and the addition of anti-oxidants to prevent rosin breakdown. Such preflux formulations have included various combinations of rosins, solvents such as xylene, toluene, methanol, ethyl acetate, and various mineral spirit-based hydrocarbons, as well as antioxidants to stabilize the rosin. These prior art preflux formulations have problems in that the solvents have low flash points which present transportation and storage hazards. Furthermore, most of the solvents have been determined to cause health risks, and pollution when released to the atmosphere.

Hayes et al., U.S. Pat. No. 4,640,719, disclose methods and compositions for removing rosin soldering flux and adhesive tape residues from printed circuit and/or wiring boards and for testing the quality of curing of U.V.-cured soldermask on such boards. The compositions contain terpene compounds, preferably in combination with terpene emulsifying surfactants to facilitate removal by rinsing in water.

Futch et al., U.S. Pat. No. 4,934,391, disclose methods and composition for removal of solder flux, screen inks, and resists from contaminated surfaces, comprising dibasic acid esters such as adipic acid, succinic acid, and dimethyl glutarate, in combination with an appropriate emulsifying agent such as ethoxylated aliphatic alcohols, ethoxylated alkyl phenols, ethoxylated amines, and the like.

SUMMARY OF THE INVENTION

It is an object of the present invention to provide an improved preflux composition which contains a non-toxic, non-hazardous, non-polluting solvent.

It is a further object of the invention to provide a preflux composition which has a low vapor pressure at room temperature and high vapor pressure at elevated temperature so as to retard solvent loss in handling and application, and to promote rapid and complete expiration in drying.

Another object is to provide an antioxidant which is compatible with the solvent system and is capable of maintaining the protective properties of the rosin through storage and multiple heat cycles.

These objects and others which will become apparent from the following disclosure are achieved by the present invention which comprises in one aspect a preflux composition comprising synthetic rosin, a solvent system comprising terpene or glycol ether, and an antioxidant system comprised of one or more phenol compounds. In another aspect, the invention comprises the use of a natural organic acid similar to rosin in acid activity and benign at room temperature, e.g., adipic acid, in the preflux composition to promote cleanability and solderability of the prepared copper.

DETAILED DESCRIPTION OF THE INVENTION AND THE PREFERRED EMBODIMENTS

The preflux compositions of the invention are coated on the surface of copper which is to be exposed to one or more heating cycles before soldering, and which must remain non-oxidized and solderable at the appropriate time. After the preflux composition is applied by conventional means, it is dried by conventional means, and is not removed. The solvent in the preflux composition is evaporated during the aforementioned drying step, and the rosin and antioxidant remain on the surface of the copper to protect it from oxidation during the aforementioned heating cycles.

Suitable rosins are those usually used in preflux compositions, but synthetic rosins are highly preferred because they are free of the tramp organic acids found in natural rosins, and their properties are more consistent and predictable. Conventional pine or tall oil rosins are extracted from vegetable matter, and are not preferred. One suitable rosin is Nirex #2150, a trademarked product sold by Arizona Chemical Co. Preferably the rosin comprises about 2 to 40 percent by weight of the preflux composition.

Suitable antioxidants are phenol compounds such as those sold by Ciba Geigy as Irganox 245 and Irganox 1024 (trademarks). These materials can also be identified by CAS 32687-78-8 and CAS 36443-68-2. Other antioxidants which perform similarly are suitable. These antioxidants are conventional in prefluxes for copper. Preferably the antioxidants comprise about 0.1 to 15 percent by weight of the preflux composition.

In sharp contrast to the conventional solvents such as xylene, toluene, methanol, ethyl acetate, and various mineral spirit-based hydrocarbons, we have discovered that the use of a terpene in the preflux composition avoids the aforementioned hazards associated with said conventional solvent systems.

The terpenes used in the preflux compositions of the invention are naturally occurring hydrocarbons extracted from, for example, pine and citrus. Suitable terpenes include pinene, both alpha and beta isomers, gamma terpinene, delta-3-carene, limonene, and dipentene (the racemic mixture of the isomers of optically active limonene), with limonene and dipentene being preferred. Mixtures of terpenes are also suitable. A particularly preferred terpene solvent is D-Limonene, a particular type of terpene derived from citrus fruit. Preferably the terpenes comprise about 10 to 80 percent by weight of the preflux composition.

We also prefer to use the combination of glycol ethers and terpenes as cosolvents. Suitable glycol ethers are aliphatic, preferably of molecular weight of about 500 to about 20,000, and which are typically products of a glycol and ethylene and/or propylene oxide, for example. Examples of glycol ethers are polypropylene glycol, polyethylene glycol, and diethylene glycol. Preferably the glycol ether solvent comprises about 10 to 80 percent by weight of the preflux composition. One especially suitable aliphatic glycol ether is sold under the trademark Arcosolve PTB by Arco Chemical Company. Such glycol ethers are conventionally used as base materials for water-soluble soldering flux and paste solder. See U.S. Pat. No. 4,988,395, for example.

We have found that a small amount of dibasic acid included in the preflux composition imparts cleanability to the coated copper. The preferred dibasic acids are adipic acid, succinic acid, and glutaric acid. We have found that about 0.1 to about 3 percent by weight is most suitable, preferably about 0.5 percent by weight.

The process of protecting the solderability of copper which is to be subjected to a heating cycle prior to soldering said copper comprises using the novel preflux composition to coat the copper and drying the resultant coating. A variety of drying methods, for example, IR, batch oven, and the like, may be used. The preferred drying method is to use a conventional dryer using IR and forced hot air to remove the solvent vapors. The board temperature should be at least 125° C. for at least 30 seconds. The resultant printed circuits or wiring board have a portion of coated copper surface which remains solderable after a first soldering step during a manufacturing process which includes at least two soldering steps.

The following example illustrates one embodiment of the invention. All parts and percentages are by weight unless otherwise indicated.

EXAMPLES

Example 1—Preflux Composition

The following preflux composition was prepared according to the invention by dissolving 8 parts of rosin (Nirez #2150, Arizona Chemical Company), 1.5 parts of antioxidant (Irganox #245, Ciba-Geigy), 1 part of second antioxidant (Irganox #1024, Ciba-Geigy) in 50 parts aliphatic glycol ether (Arcosolve PTP, Arco Chemical Company) and 38 parts terpene solvent (D-Limonene, Citrusco, Brazil). Adipic acid (0.5 parts) was also added to the preflux composition to preserve the cleaning capability. The composition was applied by dip coating to a copper test panel, and the panel was dried by heating in a batch oven at 125° C. for five minutes, causing the solvent to evaporate. The panel was then tested for solderability by the EIA "Edge Dip test" both before and after a series of three to five heating cycles at 210° C. for two minutes per cycle, and then back to room temperature which simulated the process cycles which the preflux is intended to survive. The solderability of the copper was tested and compared to control samples prepared using non-activated pine rosin which was prepared and processed with glycol ether and no anti-oxidant or terpene solvent. The results of the solderability tests were that the test samples survived and passed the solderability test whereas the control samples failed the solderability test.

While the invention and the preferred embodiments have been described with particularity herein, various alternative embodiments, modifications, and improvements should become readily apparent to those skilled in the art without departing from the spirit and scope of the invention.

What is claimed as our invention is:

1. A composition suitable for use as a preflux for protecting the solderability of copper during the heating cycle comprising rosin, antioxidant, and a solvent system comprised of glycol ether and terpene and further including sufficient dibasic acid to impart cleanability to copper coated with said composition.

2. A composition according to claim 1 wherein said dibasic acid is selected from the group consisting of adipic acid, succinic acid, and glutaric acid.

3. A composition according to claim 1 wherein said dibasic acid comprises about 0.1 to about 3 percent by weight.

* * * * *